US009633919B2

(12) United States Patent
Wan et al.

(10) Patent No.: US 9,633,919 B2
(45) Date of Patent: Apr. 25, 2017

(54) PACKAGE STRUCTURE WITH AN ELASTOMER WITH LOWER ELASTIC MODULUS

(71) Applicant: Delta Electronics (Shanghai) Co., Ltd., Shanghai (CN)

(72) Inventors: Zhengfen Wan, Shanghai (CN); Tao Wang, Shanghai (CN); Zhenqing Zhao, Shanghai (CN); Wei Cheng, Shanghai (CN); Haibin Xu, Shanghai (CN)

(73) Assignee: DELTA ELECTRONICS (SHANGHAI) CO., LTD., Shanghai (CN)

(*) Notice: Subject to any disclaimer, the term of this patent is extended or adjusted under 35 U.S.C. 154(b) by 0 days.

(21) Appl. No.: 15/068,212

(22) Filed: Mar. 11, 2016

(65) Prior Publication Data
US 2016/0351460 A1 Dec. 1, 2016

(30) Foreign Application Priority Data

May 28, 2015 (CN) .......................... 2015 1 0282494

(51) Int. Cl.
*H01L 23/12* (2006.01)
*H01L 29/66* (2006.01)
(Continued)

(52) U.S. Cl.
CPC ............ *H01L 23/24* (2013.01); *H01L 23/041* (2013.01); *H01L 24/29* (2013.01); *H01L 25/072* (2013.01); *H01L 23/4006* (2013.01); *H01L 24/32* (2013.01); *H01L 24/48* (2013.01); *H01L 24/73* (2013.01); *H01L 2224/04042* (2013.01); *H01L 2224/32225* (2013.01); *H01L 2224/48091* (2013.01); *H01L 2224/48139* (2013.01); *H01L 2224/48227* (2013.01); *H01L 2224/73265* (2013.01); *H01L 2224/8592* (2013.01); *H01L 2924/1305* (2013.01); *H01L 2924/19043* (2013.01); *H01L 2924/19105* (2013.01)

(58) Field of Classification Search
CPC ..... H01L 23/24; H01L 23/041; H01L 25/072; H01L 24/29; H01L 24/32; H01L 24/48; H01L 24/73
See application file for complete search history.

(56) References Cited

U.S. PATENT DOCUMENTS 8,354,747 B1 * 1/2013 Kuo ...................... B81B 7/0061
257/684
8,531,025 B2 * 9/2013 Edwards ................. H01L 23/04
257/706

(Continued)

*Primary Examiner* — Alonzo Chambliss
(74) *Attorney, Agent, or Firm* — Kirton McConkie; Evan R. Witt (57) ABSTRACT

A package structure includes a substrate, at least one electronic component, a housing and at least one strut. The at least one electronic component is disposed on a first surface of the substrate. The housing covers the first surface of the substrate. The housing has an accommodation space. The at least one electronic component is accommodated within the accommodation space. The at least one strut is protruded from an inner surface of the housing and extended toward the accommodation space. The at least one elastomer is arranged between the corresponding strut and the substrate.

20 Claims, 10 Drawing Sheets (51) Int. Cl.
  *H01L 23/24*  (2006.01)
  *H01L 23/04*  (2006.01)
  *H01L 23/00*  (2006.01)
  *H01L 25/07*  (2006.01)
  *H01L 23/40*  (2006.01)

(56) References Cited

U.S. PATENT DOCUMENTS

2005/0146021 A1*  7/2005  Edwards ................ H01L 23/36
                                                                257/704
2009/0256267 A1*  10/2009 Yang ................... H01L 23/3128
                                                                257/777

* cited by examiner

PACKAGE STRUCTURE WITH AN ELASTOMER WITH LOWER ELASTIC MODULUS

FIELD OF THE INVENTION

The present invention relates to a package structure, particularly to a package structure with elastomer, which can receive pressure from struts and transfer it to substrate.

BACKGROUND OF THE INVENTION

Recently, the general trends in designing electronic devices towards high density, high performance, small size, light weight and portability. Moreover, with the increasing development of electronic industries, the electronic devices are gradually modularized. Electronic components (e.g. active components and passive components) are integrated into a power module, then install the power module on a motherboard or a system circuit board.

Figure 1:
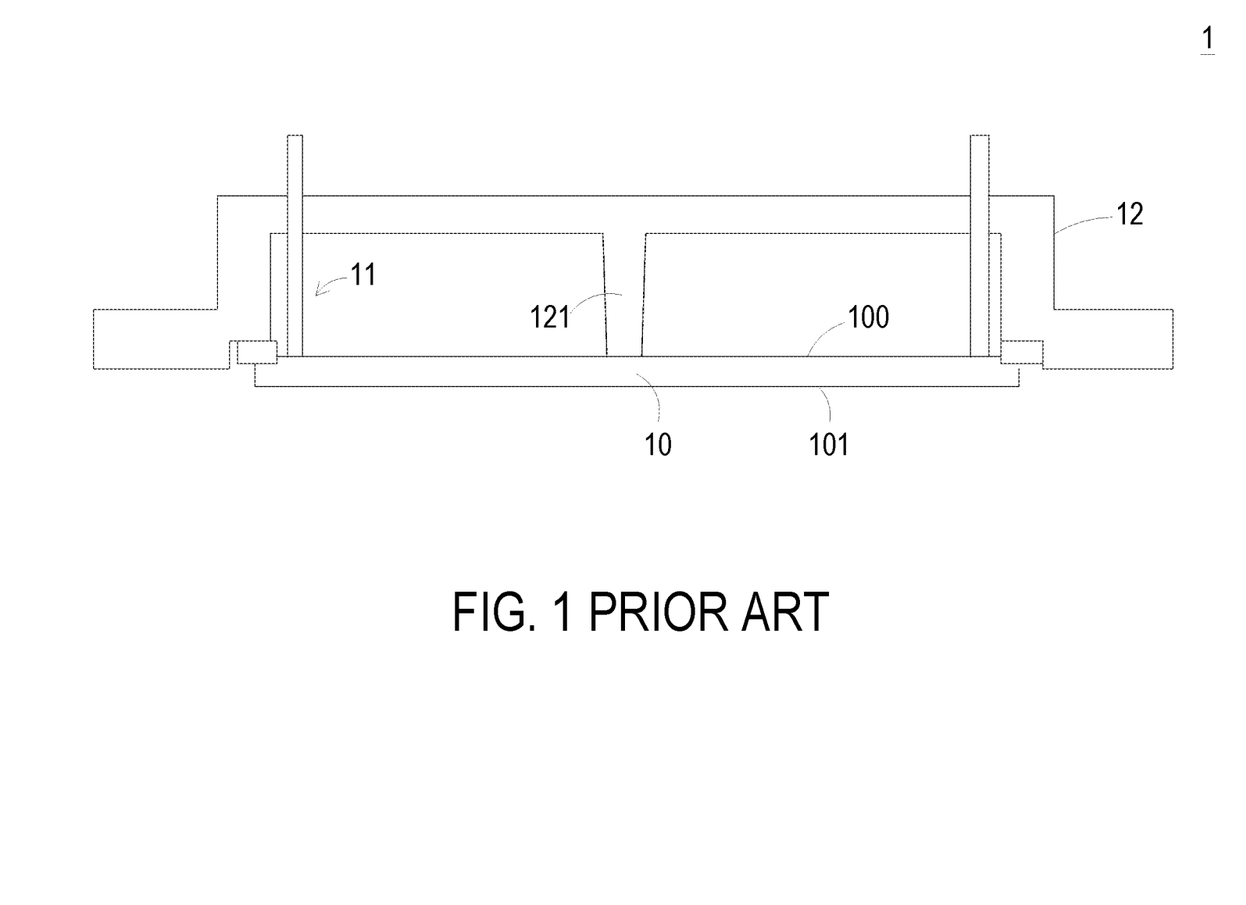
FIG. 1 schematically illustrates a package structure of a conventional power module.

FIG. 1 schematically illustrates a package structure of a conventional power module. As shown in FIG. 1, the package structure 1 comprises a substrate 10, plural pins 11 and a housing 12. A process of fabricating the package structure 1 will be illustrated as follows. Firstly, active components (not shown), passive components (not shown) and pins 11 are soldered on a first surface 100 of the substrate 10. Then, the active components, the passive components and the pins 11 are connected with each other through bonding wires (not shown) by wire-bonding process. Moreover, the active components and the passive components on the first surface 100 of the substrate 10 are covered by the housing 12. The housing 12 has plural openings (not shown) corresponding to the pins 11. The pins 11 penetrate through the corresponding openings and partially expose outside the housing 12. Through the pins 11, the power module can be connected with an external circuit. The package structure 1 of the power module is produced.

Moreover, the housing 12 further comprises at least one rigid strut 121. The rigid strut 121 protrudes from the housing 12 and extends toward the first surface 100 of the substrate 10. When the first surface 100 of the substrate 10 is covered by housing 12, the rigid strut 121 is in contact with the first surface 100 of the substrate 10 to press the first surface 100 of the substrate 10. When the package structure 1 is mounted on another device with screw, the substrate 10 can maintain flat since a portion of the substrate 10 is pressed by the rigid strut 121. For example, a heat sink may be fixed on a second surface 101 of the substrate 10, wherein the second surface 101 is opposed to the first surface 100. In response to the pressing of the rigid strut 121, the substrate 10 will be in close contact with the heat sink and thus the heat dissipating efficiency of the package structure 1 is enhanced.

Although the arrangement of the rigid strut 121 can maintain the flat state of the substrate 10 by exerting pressing force upon the first surface 101, there are still some drawbacks. For example, since the rigid strut 121 is made of a rigid material, the substrate 10 is possibly damaged by the rigid strut 121 when the rigid strut 121 is in contact with the substrate 10. Moreover, since the rigid strut 121 is in contact with the first surface 100 of the substrate 10 when the first surface 100 of the substrate 10 is covered by the housing 12, the length of the rigid strut 121 should meet stringent requirements. That is, the rigid strut 121 should be precisely machined. Under this circumstance, it is difficult to fabricate the package structure 1.

Alternatively, the rigid struts can contact with the bonding wires that are disposed on the top surfaces of the electronic components and connected with the electrodes of the electronic components, and thus the rigid struts press the substrate indirectly. However, since the rigid struts are made of a rigid material and the structural strengths of the bonding wires and the electronic components are weak, the bonding wires or the electronic components are possibly damaged by the rigid struts. Under this circumstance, the power module cannot be easily fabricated.

Therefore, there is a need of providing an improved package structure in order to overcome the drawbacks mentioned above.

SUMMARY OF THE INVENTION

The present invention provides a package structure with an elastomer. The elastomer is arranged between a strut and a substrate for receiving a pressure from the strut and transmitting the pressure to the substrate. Consequently, the possibility of damaging the substrate, bonding wire or electronic component may be minimized. Moreover, since it is not necessary to precisely machine the strut, the fabricating process of the package structure may become easier.

The package structure includes a substrate, at least one electronic component, one housing and at least one strut. The electronic component is disposed on the first surface of the substrate. The housing covers the first surface of the substrate. The housing has an accommodation space. The electronic component is accommodated within the accommodation space. The strut protrudes from an inner surface of the housing and extends toward the accommodation space. The elastomer is arranged between the corresponding strut and the substrate, and configured for transmitting pressure from the corresponding strut to the substrate. The elastic modulus of elastomer should be lower than 1000 MPa.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 2:
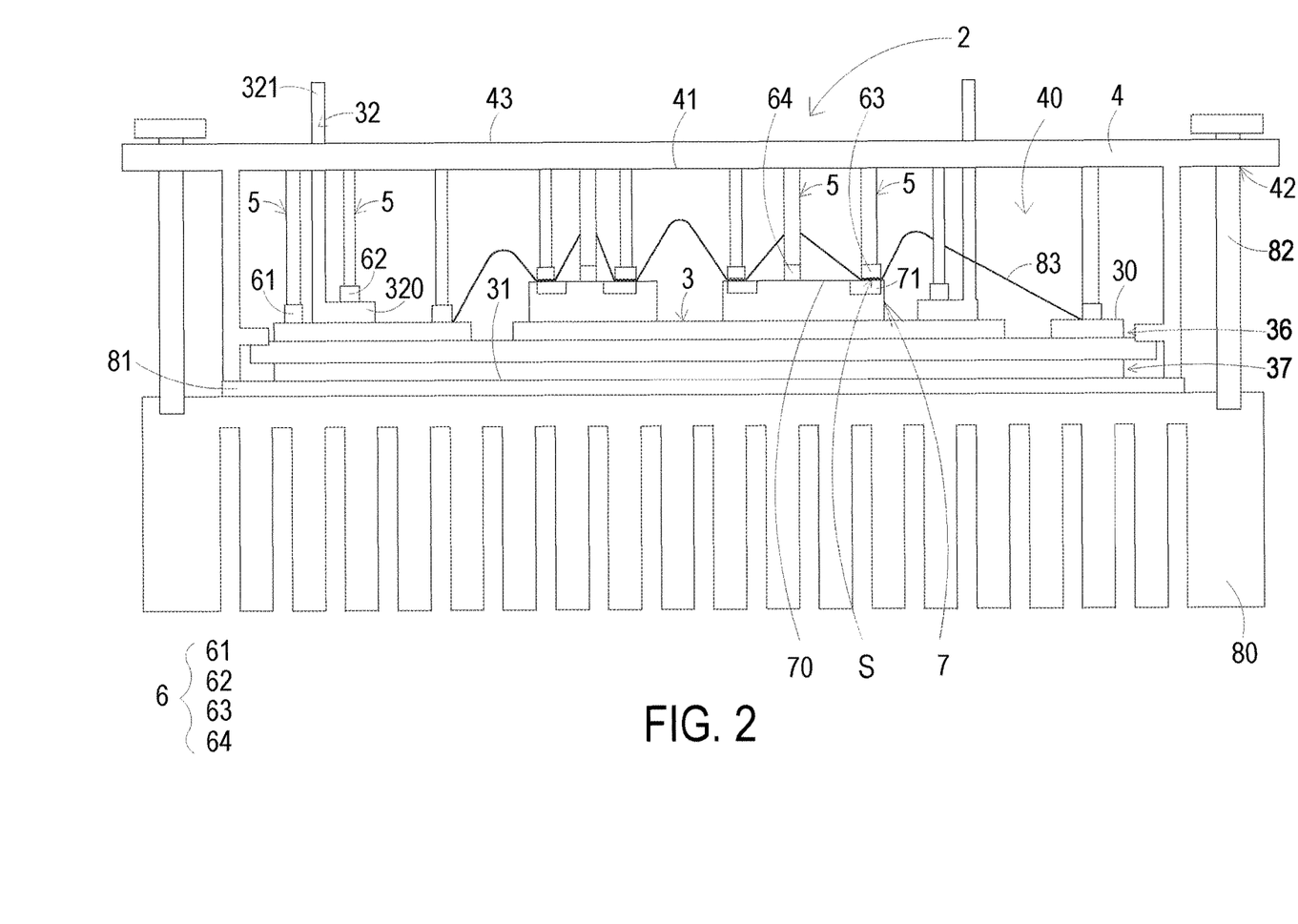
FIG. 2 schematically illustrates a package structure according to a first embodiment of the present invention.

FIG. 2 schematically illustrates a package structure according to a first embodiment of the present invention. As shown in FIG. 2, the package structure 2 comprises a substrate 3, a housing 4, at least one strut 5 and at least one elastomer 6. The substrate 3 has a first surface 30 and a second surface 31. At least one electronic component 7 is disposed on the first surface 30 of the substrate 3. The housing 4 is disposed on the first surface 30 of the substrate 3 for covering the first surface 30 of the substrate 3. Moreover, the housing 4 has an accommodation space 40 for accommodating the electronic component 7.

A first end of the strut 5 is disposed on an inner surface 41 of the housing 4. A second end of the strut 5 extends toward the first surface 30 of the substrate 3. Preferably but not exclusively, the elastic modulus of the elastomer 6 is lower than 1000 MPa. Moreover, the elastomer 6 is arranged between the substrate 3 and the strut 5. The elastomer 6 is configured to receive a pressure from the strut 5 and transmit the pressure to the substrate 3 directly or indirectly.

Moreover, a first conductive layer 36 is located at a first side of the substrate 3, and a second conductive layer 37 is located at a second side of the substrate 3. In this embodiment, an outer surface of the first conductive layer 36 is the first surface 30 of the substrate 3, and an outer surface of the second conductive layer 37 is the second surface 31 of the substrate 3. Preferably but not exclusively, the first conductive layer 36 and the second conductive layer 37 are made of copper.

An example of the substrate 3 includes but is not limited to a direct bonding copper (DBC) substrate, a direct bonding aluminum (DBA) substrate, a low-temperature co-fired ceramic (LTCC) substrate, a direct plated copper (DPC) substrate, an insulated metal substrate (IMS) or a printed circuit board (PCB). Moreover, the second surface 31 of the substrate 3 is attached to a heat dissipation device 80 through a thermally conductive material 81. For example, the heat dissipation device 80 can be a heat sink. With the application of the heat dissipation device 80, the heat dissipating efficiency of the package structure 2 is enhanced. An example of the thermally conductive material 81 includes, but is not limited to, thermal grease. With the thermally conductive material 81, the heat conduction between the substrate 3 and the heat dissipation device 80 can be improved.

The housing 4 of the package structure 2 also comprises at least a fastening hole 42. The fastening hole 42 runs through an outer surface 43 and the inner surface 41 of the housing 4. After a fastening element 82 (e.g., a screw) penetrates through the fastening hole 42 and is tightened into the heat dissipation device 80, the package structure 2 is fixed on the heat dissipation device 80 through the fastening element 82. In response to mounting of the fastening element 82, a pressure is applied to the elastomer 6 through the strut 5.

In this invention, the electronic component 7 includes, but is not limited to, an active component (e.g., a power semiconductor bare chip) or a passive component (e.g., a resistor). The electronic component 7 can be mounted to the first surface 30 of the substrate 3 with solder paste (not shown). An electrode of the electronic component 7 contacts with a segment of a bonding wire 83. In the case that the electronic component 7 is an active component such as a bipolar transistor, the electrodes 71 can be a gate electrode, an emitter electrode or a collector electrode. A top surface 70 of the electronic component 7 has a bonding region S. The bonding region S is the junction between the electrode 71 of the electronic component 7 and the bonding wire 83. Through the bonding wire 83, the electrode 71 of electronic component 7 is electrically connected with the electrode 71 of the adjacent electronic component 7.

Moreover, at least one pin 32 is disposed on the first surface 30 of the substrate 3. A first end 320 of the pin 32 is soldered on the first surface 30 of the substrate 3. A second end 321 of the pin 32 penetrates through a corresponding opening (not shown) of the housing 4 and partially exposes outside the housing 4. In some embodiment, a portion of the bonding wire 83 can electrically connect to the pin 32 or traces of the substrate 3.

In some embodiments, the strut 5 and the housing 4 are individual components, and the first end of the strut 5 is fixed on the inner surface 41 of the housing 4. In particular, the first end of the strut 5 can be fixed on the inner surface 41 of the housing 4 by structure or an adhesive means. In some other embodiments, the strut 5 can be integrated into the housing 4.

In this embodiment, the package structure 2 comprises several struts 5 and several elastomers 6. The number of the elastomers 6 is equal to the number of the struts 5. The elastomers 6 are arranged between the corresponding struts 5 and the substrate 3. In particular, the elastomer 6 can also be arranged between the strut 5 and the corresponding first surface 30 of the substrate 3, between the strut 5 and the corresponding first end 320 of the corresponding pin 32, between the strut 5 and the corresponding bonding wire 83 (the part on the top of bonding region S) and/or between the corresponding strut 5 and the top surface 70 of the corresponding electronic component 7. As shown in FIG. 2, the elastomers 6 comprise a first elastomer 61, a second elastomer 62, a third elastomer 63 and a fourth elastomer 64. The first elastomer 61 is arranged between the corresponding strut 5 and the first surface 30 of the substrate 3. That is, a top end of the first elastomer 61 is in contact with the corresponding strut 5, and a bottom end of the first elastomer 61 is in contact with the first surface 30 of the substrate 3. Consequently, the pressure from the corresponding strut 5 is transmitted to the first surface 30 of the substrate 3 through the first elastomer 61. The second elastomer 62 is arranged between the corresponding strut 5 and the first end 320 of the corresponding pin 32. That is, a top end of the second elastomer 62 is in contact with the corresponding strut 5, and a bottom end of the second elastomer 62 is in contact with the first end 320 of the corresponding pin 32. Consequently, the pressure from the corresponding strut 5 is transmitted to the first surface 30 of the substrate 3 through the second elastomer 62 and the pin 32. The third elastomer 63 is between the corresponding strut 5 and the corresponding bonding wire 83 (the part on the top of bonding region S). That is, a top end of the third elastomer 63 is in contact with the corresponding strut 5, and a bottom end of the third elastomer 63 is in contact with the corresponding bonding wire 83 (the part on the top of bonding region S). Consequently, the pressure from the corresponding strut 5 is transmitted to the first surface 30 of the substrate 3 through the third elastomer 63, the corresponding bonding wire 83 and the corresponding electronic component 7. The fourth elastomer 64 is arranged between the corresponding strut 5 and the top surface 70 of the corresponding electronic component 7. That is, a top end of the fourth elastomer 64 is in contact with the corresponding strut 5, and a bottom end of the fourth elastomer 64 is in contact with the top surface 70 of the corresponding electronic component 7. Consequently, the pressure from the corresponding strut 5 is transmitted to the first surface 30 of the substrate 3 through the fourth elastomer 64 and the corresponding electronic component 7.

It is noted that numerous modifications and alterations may be made while retaining the teachings of the invention. In some embodiments, the surface of the substrate 3, the surface of the electronic component 7, the surface of the bonding wire 83 and/or the surface of the pin 32 may be coated with a protective layer (e.g., an epoxy resin protective layer). The protective layer can protect the substrate 3, the electronic component 7, the bonding wire 83 and/or the pin 32. In other words, the elastomer 6 can be arranged between the corresponding strut 5 and the protective layer of the first surface 30 of the substrate 3, between the corresponding strut 5 and the protective layer of the first end 320 of the corresponding pin 32, between the corresponding strut 5 and the protective layer of the corresponding bonding wire 83, and/or between the corresponding strut 5 and the protective layer of the corresponding electronic component 7.

The method of producing the elastomer 6 is not restricted. For example, the elastomer 6 may be an implanted elastic material or a pre-formed elastic film. Alternatively, the elastomer 6 may be produced by a spraying process or a spin coating process. In an embodiment, the elastomer 6 is firstly placed on the first surface 30 of the substrate 3 and then contacts with the corresponding strut 5. Alternatively, the elastomer 6 is firstly attached on the corresponding strut 5 and then contacts with the first surface 30 of the substrate 3. An example of the material of the elastomer 6 includes but is not limited to rubber, silicon, organic polymer or carbon nano-material. Preferably but not exclusively, the elastic modulus of the elastomer 6 is lower than 10 MPa.

Referring to FIG. 2, the fourth elastomer 64 is arranged between the corresponding strut 5 and the top surface 70 of the corresponding electronic component 7. In the case that the electronic component 7 is an active component, the contact area between the bottom surface of the fourth elastomer 64 and the top surface 70 of the electronic component 7 can be smaller than the area of the top surface 70 of the electronic component 7, avoiding the edge area, which is fragile. Consequently, the pressure from the corresponding strut 5 can be uniformly transmitted to the top surface 70 of the electronic component 7 through the fourth elastomer 64 while damaging to the edge region of the electronic component 7 can be avoided. For example, the contact area between the bottom surface of the fourth elastomer 64 and the top surface 70 of the electronic component 7 can range from 1 to 45 square millimeters.

Moreover, depending on the material that contacts with the bottom surface of the elastomer 6, the elastic modulus of the elastomer 6 varies. For example, since the bottom surfaces of the first elastomer 61, the second elastomer 62, the third elastomer 63 and the fourth elastomer 64 are in contact with different materials, the first elastomer 61, the second elastomer 62, the third elastomer 63 and the fourth elastomer 64 have different elastic modulus.

In some other embodiments, the elastomer 6 is thermally conductive. Preferably but not exclusively, the thermal conductivity of the elastomer 6 is larger than 0.5 W/m·K. Consequently, the heat generated by the electronic component 7 of the package structure 2 can be transferred downwardly to the heat dissipation device 80 through the substrate 3, or the heat generated by the electronic component 7 of the package structure 2 can be transferred upwardly to the surroundings through the elastomer 6, the corresponding strut 5 and the housing 4.

Figure 3:
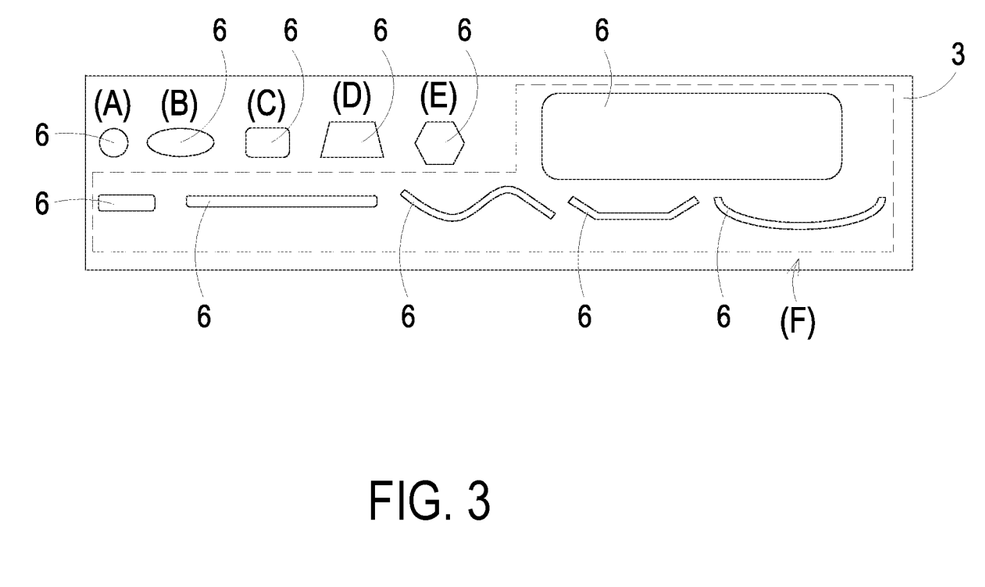
FIG. 3 is a schematic cross-sectional view of the package structure of the present invention and taken along the horizontal direction.

FIG. 3 is a schematic cross-sectional view of the package structure of the present invention, taken along the horizontal direction. As show in FIG. 3, the elastomers 6 have diversified profiles. For example, the horizontal cross section of the elastomer 6 has a circular profile (A), an elliptical profile (B), a quadrilateral profile (C), a trapezoid profile (D) or a hexagonal profile (E). Alternatively, the cross sections of the elastomers have the irregular profiles (F).

Figure 4:
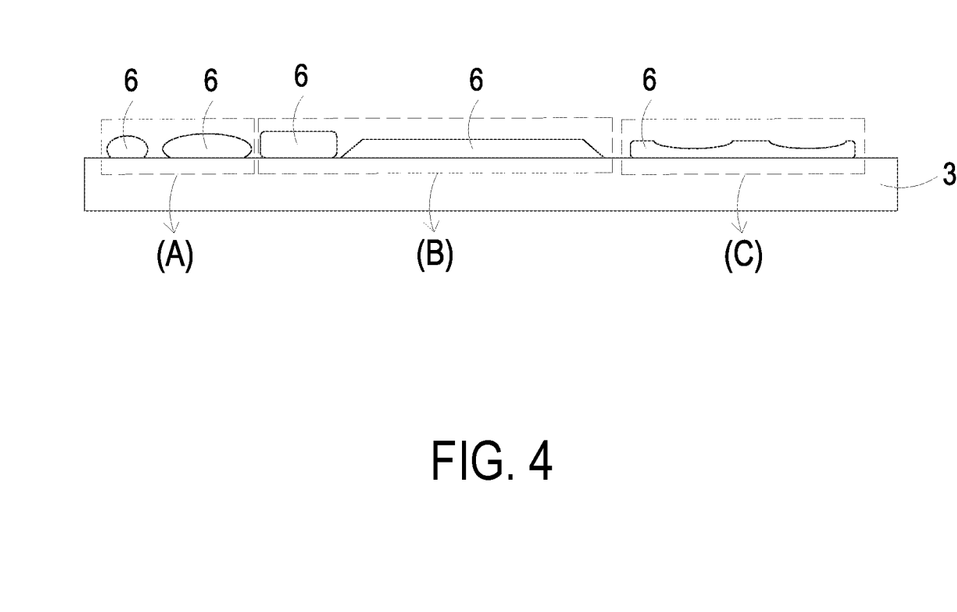
FIG. 4 is a schematic cross-sectional view of the package structure of the present invention and taken along the vertical direction.

FIG. 4 is a schematic cross-sectional view of the package structure of the present invention and taken along the vertical direction. For example, the vertical cross section of the elastomer 6 has a circular profile (A), a quadrilateral profile (B) or a top concave profile (C). It is noted that the vertical cross section of the elastomer 6 may have an irregular profile. Moreover, the heights of the elastomers may be identical or different.

Some variant examples of the package structure 2 will be illustrated as follows. Component parts and elements corresponding to those of the first embodiment are designated by identical numeral references, and detailed descriptions thereof are omitted.

Figure 5:
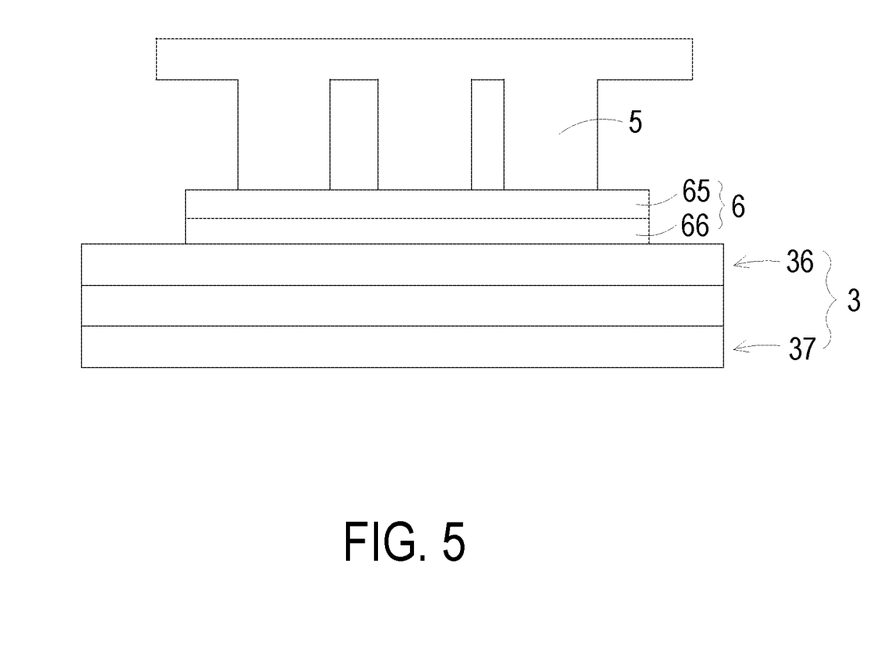
FIG. 5 schematically illustrates a portion of a package structure according to a second embodiment of the present invention.

FIG. 5 schematically illustrates a portion of a package structure according to a second embodiment of the present invention. In this embodiment, the top surface and the bottom surface of the elastomer 6 are in contact with the objects of different materials. For providing better elastic properties, the elastomer 6 comprises a first elastic part 65 and a second elastic part 66. The first elastic part 65 is located over the second elastic part 66. The first elastic part 65 and the second elastic part 66 of the elastomer 6 have different elastic modulus. Moreover, as shown in FIG. 5, the second ends of plural struts 5 are in contact with the same elastomer 6.

Figure 6A:
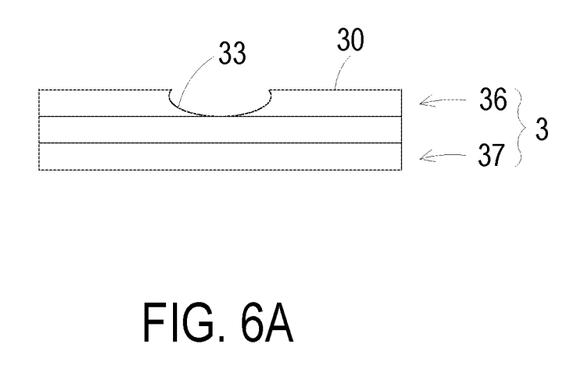
FIG. 6A schematically illustrates a portion of a package structure according to a third embodiment of the present invention.
Figure 6B:
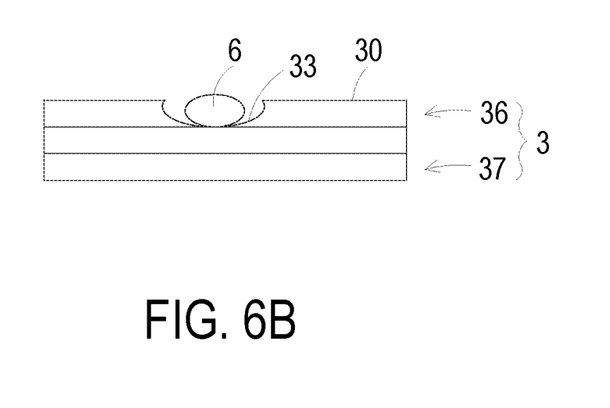
FIG. 6B schematically illustrates the relationship between an elastomer and a substrate of the package structure according to the third embodiment of the present invention.
Figure 6C:
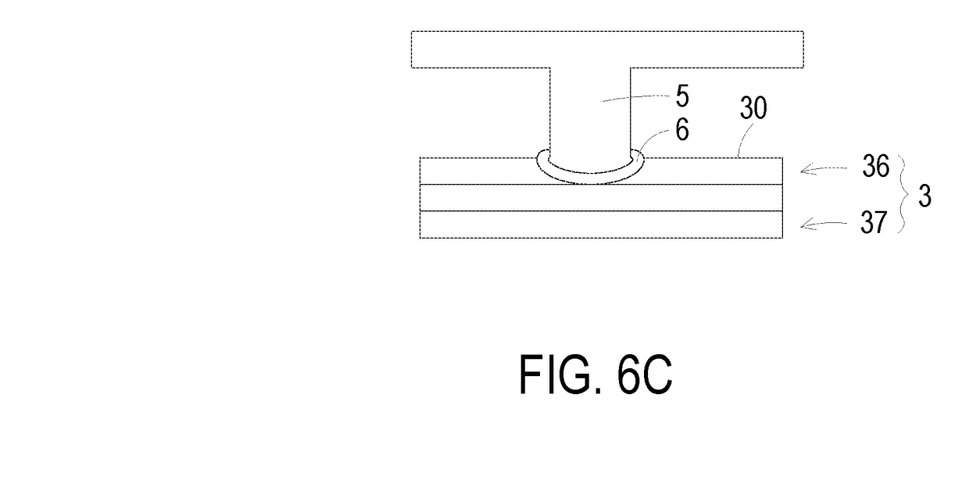
FIG. 6C schematically illustrates the relationship between a strut, the elastomer and the substrate of the package structure according to the third embodiment of the present invention.

FIG. 6A schematically illustrates a portion of a package structure according to a third embodiment of the present invention. FIG. 6B schematically illustrates the relationship between an elastomer and a substrate of the package structure according to the third embodiment of the present invention. FIG. 6C schematically illustrates the relationship between a strut, the elastomer and the substrate of the package structure according to the third embodiment of the present invention. In this embodiment, the first surface 30 of the substrate 3 can comprise a fixing recess 33 (see FIG. 6A). The fixing recess 33 can be formed by an etching process. The elastomer 6 is partially accommodated within the fixing recess 33 (see FIG. 6B). Moreover, a part of the strut 5 is fixed in the fixing recess 33 (see FIG. 6C). When the strut 5 is partially fixed in the fixing recess 33, the elastomer 6 is contacted with the strut 5 and the fixing recess 33 and subjected to deformation. Consequently, the elastomer 6 is arranged between the strut 5 and the fixing recess 33.

Figure 7:
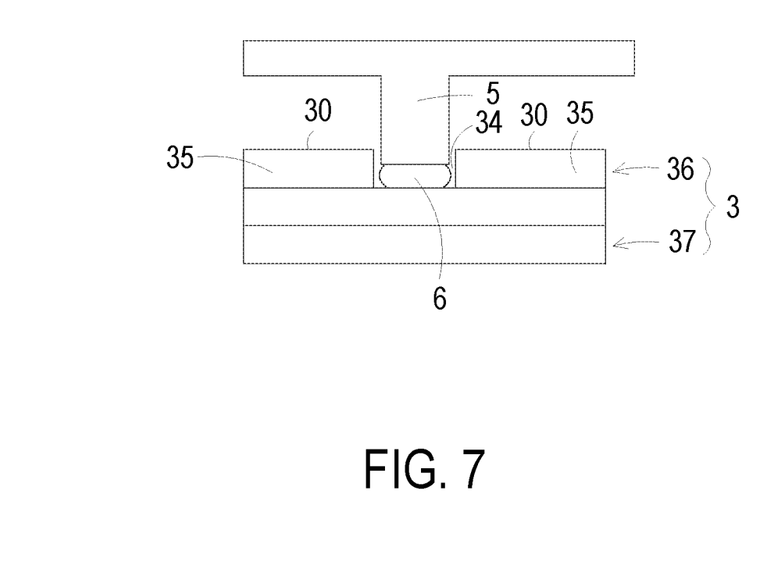
FIG. 7 schematically illustrates a portion of a package structure according to a fourth embodiment of the present invention.

FIG. 7 schematically illustrates a portion of a package structure according to a fourth embodiment of the present invention. As shown in FIG. 7, an insulation trench 34 is formed in the first conductive layer 36 of the substrate 3 by an etching process. By the insulation trench 34, the first conductive layer 36 is divided into plural conductive parts 35, and the plural conductive parts 35 are isolated from each other. Each of the conductive parts 35 is contacted with a conductive terminal (not shown) of the corresponding electronic component. Moreover, the elastomer 6 is accommodated within the insulation trench 34. For maintaining the isolation between the plural conductive parts 35, the elastomer 6 is made of an insulation material. Moreover, the strut 5 is partially accommodated within the insulation trench 34 and contacts with the elastomer 6. Since the elastomer 6 is accommodated within the insulation trench 34, the layout area of the first surface 30 of the substrate 3 is not adversely affected. Consequently, the size of the package structure 2 can be reduced.

Figure 8:
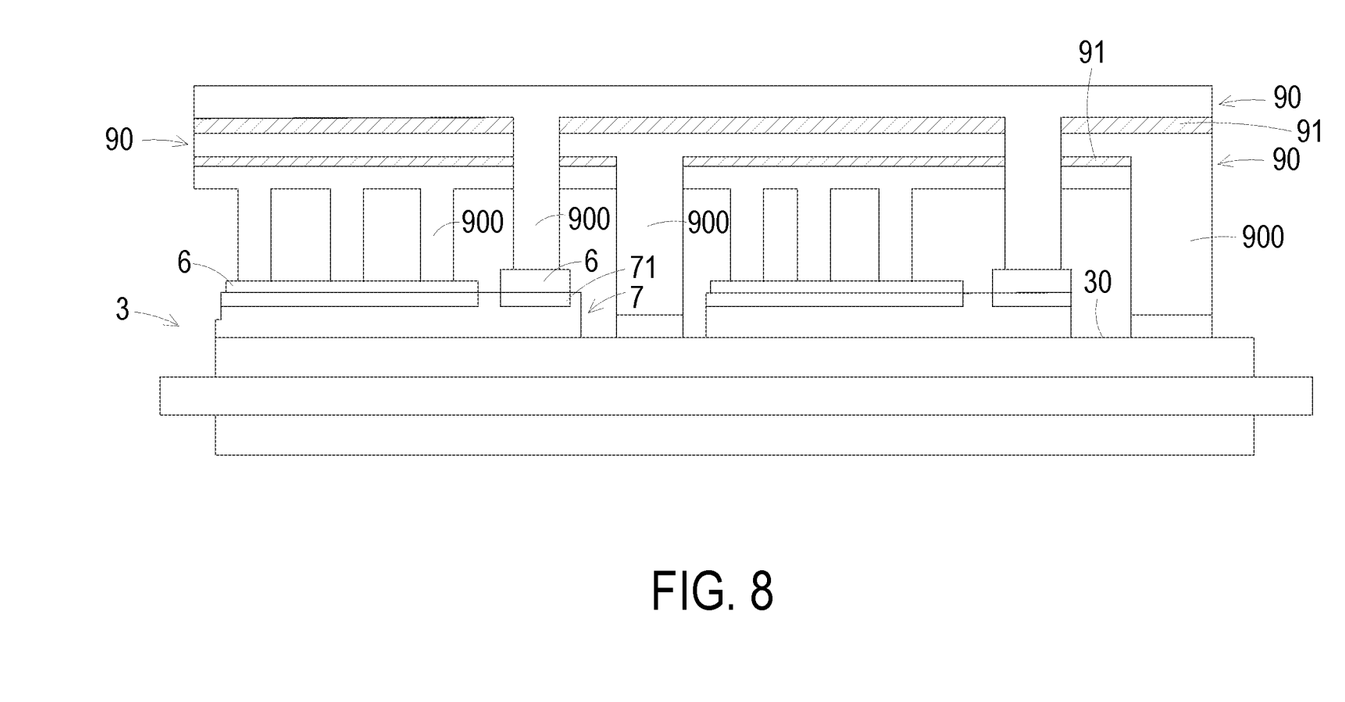
FIG. 8 schematically illustrates a portion of a package structure according to a fifth embodiment of the present invention.

FIG. 8 schematically illustrates a portion of a package structure according to a fifth embodiment of the present invention. In this embodiment, the elastomer 6 is electrically conductive. Preferably but not exclusively, the electrical resistivity of the elastomer 6 is smaller than 1 ohm•m. In this embodiment, the package structure further comprises at least one conductive structure, which is made of an electrically conductive material. As shown in FIG. 8, the package structure comprises three conductive structures 90. The conductive structures 90 are located over the first surface 30 of the substrate 3 and arranged beside the inner surface of the housing (not shown). Moreover, the conductive structures 90 are partially exposed outside the housing so as to be electrically connected with an external circuit (not shown). The conductive structures 90 comprise electrically-conductive struts 900 in place of the struts 5 of FIG. 2. The electrically-conductive struts 900 extend toward the first surface 30 of the substrate 3. The bottom surfaces of the elastomers 6 are contacted with the electrode 71 of the electronic component 7 and/or the first surface 30 of the substrate 3. The top surfaces of the elastomers 6 are contacted with the corresponding electrically-conductive struts 900. As a consequence, the conductive structures 90 are electrically connected with the electrode 71 of the electronic component 7 and/or the traces of the substrate 3 through the electrically-conductive struts 900 and the elastomers 6. In other words, the purpose of mechanically fixing the substrate may be achieved by the electrically-conductive struts 900 and the elastomers 6, and instead of bonding wire connection, the inner components of the package structure are electrically connected with the external circuit through the electrically-conductive struts 900 and the elastomers 6. Consequently, the packaging efficiency is enhanced. Moreover, the conductive structures 90 are isolated from each other through insulation layers 71.

From the above descriptions, the present disclosure provides a package structure with an elastomer. The elastomer is arranged between a strut and a substrate for receiving pressure from the strut and transmitting the pressure to the substrate. Due to the elastomer, the pressure from the elastomer may be uniformly exerted on the substrate. Moreover, since it is not necessary to precisely machine the strut, the cost of the package structure fabrication may be reduced. Moreover, since the pressure from the corresponding strut is indirectly exerted on the substrate, the corresponding bonding wire, the corresponding electronic component or the pin through the elastomer, the possibility of damaging the substrate, the bonding wire, the electronic component or the pin may be minimized. In accordance with the present invention, the pressure from the corresponding strut is indirectly exerted on the substrate, the corresponding bonding wire, the corresponding electronic component 7 or the pin through the elastomer. Consequently, the space utilization of the substrate of the package structure of the present invention may be enhanced and the density of the electronic components may be increased.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A package structure, comprising:
a substrate;
at least one electronic component disposed on a first surface of the substrate;
a housing disposed on the first surface of the substrate for covering the first surface of the substrate, wherein the housing has an accommodation space, and the at least one electronic component is accommodated within the accommodation space;
at least one strut protruded from an inner surface of the housing and extended toward the accommodation space; and
at least one elastomer arranged between the corresponding strut and the substrate, wherein pressure from the corresponding strut is transmitted to the substrate through the at least one elastomer,
wherein an elastic modulus of the at least one elastomer is lower than 1000 MPa.

2. The package structure according to claim 1, wherein the elastic modulus of the at least one elastomer is lower than 10 MPa.

3. The package structure according to claim 1, wherein the at least one strut is fixed on the inner surface of the covering member through a coupling means.

4. The package structure according to claim 1, wherein the at least one strut is integrally formed with the housing.

5. The package structure according to claim 1, wherein a top surface of the elastomer is in contact with the corresponding strut, and a bottom surface of the elastomer is in contact with the first surface of the substrate.

6. The package structure according to claim 1, further comprising at least one pin, wherein a first end of the pin is disposed on the first surface of the substrate, and a second end of the pin penetrates through the housing and partially exposed outside the housing.

7. The package structure according to claim 6, wherein a top surface of the elastomer is in contact with the corresponding strut, and a bottom surface of the elastomer is in contact with the first end of the pin.

8. The package structure according to claim 1, wherein the electronic component is an active component, a top surface of the elastomer is in contact with the active component, and a bottom surface of the elastomer is in contact with a top surface of the active component.

9. The package structure according to claim 8, wherein a contact area between the bottom surface of the elastomer and the top surface of the active component is smaller than an area of the top surface of the active component.

10. The package structure according to claim 9, wherein the contact area between the bottom surface of the elastomer and the top surface of the active component is in a range between 1 and 45 square millimeters.

11. The package structure according to claim 1, wherein an electrode of the electronic component is in contact with a segment of a bonding wire, a top surface of the electronic component has a bonding region, and the bonding region is a junction between the electrode of the electronic component and the bonding wire.

12. The package structure according to claim 11, wherein a top surface of the elastomer is in contact with the corresponding strut, and a bottom surface of the elastomer is contacted with the segment of the bonding wire.

13. The package structure according to claim 1, wherein the at least elastomer comprises a first elastomer, a second elastomer, a third elastomer and a fourth elastomer, wherein a bottom surface of the first elastomer is in contact with the first surface of the substrate, a bottom surface of the second elastomer is in contact with a pin, and a bottom surface of the third elastomer is in contact with a segment of a bonding wire, and a bottom surface of the fourth elastomer is in contact with a top surface of the corresponding electronic component, wherein the first elastomer, the second elastomer, the third elastomer and the fourth elastomer have different elastic modulus.

14. The package structure according to claim 1, wherein a horizontal cross section of the elastomer has a circular profile, an elliptical profile, a quadrilateral profile, a trapezoid profile, a hexagonal profile or an irregular profile.

15. The package structure according to claim 1, wherein a vertical cross section of the elastomer has a circular profile, a quadrilateral profile, a concave top profile or an irregular profile.

16. The package structure according to claim 1, wherein the elastomer comprises a first elastic part and a second elastic part, wherein the first elastic part is located over the second elastic par, and the first elastic part and the second elastic part have different elastic modulus.

17. The package structure according to claim 1, wherein the first surface of the substrate further comprises a fixing recess, wherein the elastomer is partially accommodated within the fixing recess, and a part of the strut is fixed in the fixing recess, wherein when the strut is fixed in the fixing recess, the elastomer is contacted with the strut and subjected to deformation, so that the elastomer is arranged between the strut and the fixing recess.

18. The package structure according to claim 1, wherein the substrate further comprises a first conductive layer, and an outer surface of the first conductive layer is the first surface of the substrate, wherein the first conductive layer further comprises at least one insulation trench, and the first conductive layer is divided into plural separate conductive parts by the at least one insulation trench, wherein the elastomer is accommodated within the corresponding insulation trench and contacted with the corresponding strut, wherein the elastomer is made of an insulation material.

19. The package structure according to claim 1, wherein the strut is made of an electrically conductive material, the elastomer is electrically conductive, and an electrical resistivity of the elastomer is smaller than 1 ohm•meter.

20. The package structure according to claim 1, wherein the elastomer is thermally conductive, and a thermal conductivity of the elastomer is larger than 0.5 W/m•K.

* * * * *